United States Patent

Kim et al.

Patent Number: 6,040,641
Date of Patent: Mar. 21, 2000

[54] METHOD FOR MANUFACTURING PROBABILISTIC SWITCH USING MULTIPLICATIVE NOISE

[75] Inventors: Seung-Hwan Kim; Seon-Hee Park; Chang-Su Ryu, all of Daejeon, Rep. of Korea

[73] Assignee: Electronics and Telecommunications Research Institute, Daejeon, Rep. of Korea

[21] Appl. No.: 08/882,875

[22] Filed: Jun. 26, 1997

[30] Foreign Application Priority Data

Jun. 27, 1996 [KR] Rep. of Korea ............... 96-24715

[51] Int. Cl.[7] .............................. H01H 1/04; H02B 1/24
[52] U.S. Cl. .............................. 307/112; 327/334
[58] Field of Search .............................. 307/112, 116, 307/125, 126, 130, 131, 139, 140, 149; 395/311; 364/709.01, 724.014; 327/100, 113, 119, 324, 334, 344; 341/107

[56] References Cited

U.S. PATENT DOCUMENTS 3,859,513  1/1975  Chuang et al. .................. 235/153
5,550,490  8/1996  Durham et al. .................. 326/98
5,680,518  10/1997 Hangartner .................... 395/61

OTHER PUBLICATIONS

Taku Uchino et al. "Switching Activity Analysis for Sequential Circuits using Boolean Approximation Method" (IEEE 0–7803–3571–8/96) 1996.

Abbas Seifi, "Probabilistic Design of Integrated Circuits with Correlated Input Parameters", IEEE Transactions on Computer–Aided Design of Integrated Circuits and Systems, vol. 18, No. 8, Aug. 1999.

Primary Examiner—Jeffrey Gaffin
Assistant Examiner—Peter Zura
Attorney, Agent, or Firm—Cohen, Pontani, Lieberman & Pavane

[57] ABSTRACT

A method for manufacturing a probabilistic switch using multiplicative noise, which can be used in a probabilistic computer is disclosed. The probabilistic switch, in which the probability varies with the initial condition and multiplicative noise intensity, is realized by applying the multiplicative noise whose intensity varies with the state of a nonlinear device to the nonlinear device. When the switch is applied to a probabilistic computer, a complicated problem can be solved rapidly in shorter time.

3 Claims, 5 Drawing Sheets

METHOD FOR MANUFACTURING PROBABILISTIC SWITCH USING MULTIPLICATIVE NOISE

BACKGROUND OF THE INVENTION

1. Field of the Invention

The present invention relates to a method for manufacturing a probabilistic switch which can be used in a probabilistic computer and, more particularly, to a method for manufacturing a probabilistic switch using multiplicative noise in a nonlinear device.

2. Discussion of Related Art

A conventional switch, a logic device whose output depends on its input, decisively has an output value of '0' or '1'. With this switch, the same input always produces the same output. Thus, the switch performs one-step computation at a time. When the switch is used in the conventional von Neumann computer, the number of computation step is increased in the form of exponential function according to the system scale. That is, a complicated problem takes a lot of time.

The 'traveling salesman problem' may serve as an example of the complicated problem. This is how to decide the shortest traveling route when a salesman travels many cities to sale goods. With this problem, the number of computation step is increased in exponential function as the number of city is increased. If the number of city exceeds twenty, correct solution cannot be obtained by the computation which is performed one step at a time.

SUMMARY OF THE INVENTION

Accordingly, the present invention is directed to a method for manufacturing a probabilistic switch using multiplicative noise that substantially obviates one or more of the problems due to limitations and disadvantages of the related art.

An object of the present invention is to provide a method for manufacturing a probabilistic switch which can be used in a probabilistic computer probabilistically performing computation, to rapidly solve a problem required for a lot of time.

Additional features and advantages of the invention will be set forth in the description which follows, and in part will be apparent from the description, or may be learned by practice of the invention. The objectives and other advantages of the invention will be realized and attained by the structure particularly pointed out in the description and claims hereof as well as the appended drawings.

To achieve these and other advantages and in accordance with the purpose of the present invention, as embodied and broadly described, a method for manufacturing a probabilistic switch which probabilistically operates, to be used in a probabilistic computer probabilistically carrying out computation, includes the steps of: preparing a nonlinear device which operates in response to an electrical signal; applying a multiplicative noise, whose intensity varies with the operation state of the nonlinear device, to the nonlinear device; and controlling the applied multiplicative noise and initial condition of the electrical signal applied to the nonlinear device, so as to control probability, to thereby probabilistically take logic signal states different from each other.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

The "probabilistic switch" means a switch which can be used in a probabilistic computer. When a predetermined initial condition (input value) and multiplicative noise intensity are given, the switch operates according to a probability under the condition where a probability, in which the output value of the probabilistic switch is '0', is set to 70%, and probability, in which the output value of the switch is '1', is set to 30%. That is, the switch probabilistically has a value '0' or '1'. The probability of 70% or 30% depends on the initial condition and multiplicative noise intensity. The "multiplicative noise" means the noise whose intensity varies with the state of the system, and "initial condition" means the initial state where the system is initialized.

Figure 1:
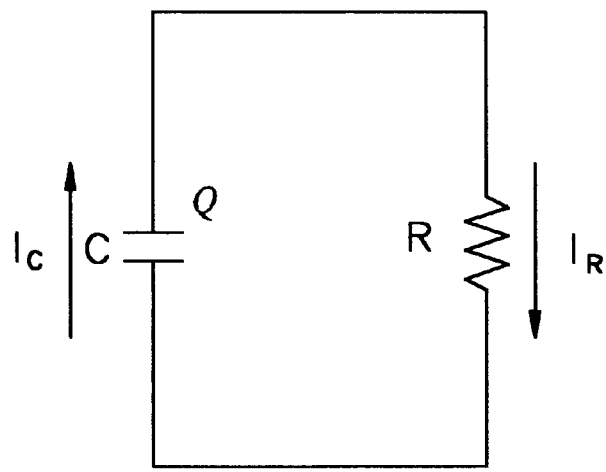
FIG. 1 shows a nonlinear device to which the present invention is applied.

A preferred embodiment of the present invention will be explained below with reference to the accompanying drawings. FIG. 1 shows an example of a nonlinear device to which the probabilistic switch of the present invention is applied.

$$\frac{dX}{dt} = -X + X^2 \tag{1}$$

Where X indicates the state of the nonlinear device. There are many nonlinear devices which can be represented by equation (1). One of those is a resistor R showing nonlinear current/voltage characteristic. When the resistor is connected to a capacitor C, current $I_c$, which flows through the capacitor, is represented by the following equation.

$$I_c = \frac{dQ}{dt} = C\frac{dV}{dt} \tag{2}$$

Where Q indicates the charge amount of the capacitor, C capacitance of the capacitor, V voltage applied across the capacitor, and t time. Current $I_R$ which flows through the nonlinear resistor R, is represented by the following equation.

$$I_R = \frac{V}{R} - \alpha V^2 \quad (3)$$

Where R indicates the linear resistance value, and α indicates the parameter showing the nonlinearity of the nonlinear resistor R. Meanwhile, according to the charge conservation law, $$I_c + I_R = \quad (4)$$

Thus, if equations (2) and (3) are substituted for $I_c$ and $I_R$ of equation (4), $$C\frac{dV}{dt} = -\frac{V}{R} + \alpha V^2 \quad (5)$$

If V and t are rescaled by, $$V = \frac{X}{\alpha}R, t \rightarrow RCt \quad (6)$$

equation (5) becomes equation (1). Since equation (1) has a fixed point at X=0, it converges to X=0 over time. That is, equation (1) always takes the value X=0 without regard to the initial condition. This initial condition means the initial state of the voltage, i.e., the voltage at time t=0.

Figure 2:
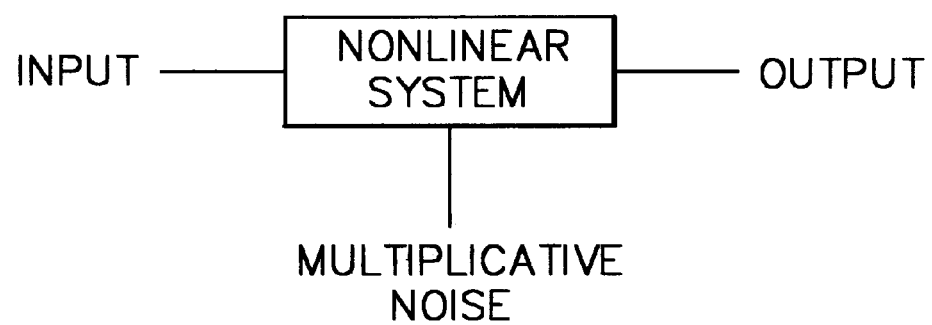
FIG. 2 shows the conception of a probabilistic switch according to the present invention.

FIG. 2 shows the conception of the probabilistic switch of the present invention. The probabilistic switch consists of a nonlinear system, multiplicative noise applied to the nonlinear system, an input port controlling the initial value of the nonlinear system, and an output port presenting switch value of the nonlinear system. An electric circuit, whose voltage is probabilistically given, can be formed when a capacitor with fluctuating capacitance, or resistor with fluctuating resistance is connected to it. The probabilistic switch can be manufactured using this electric circuit.

Figure 3:
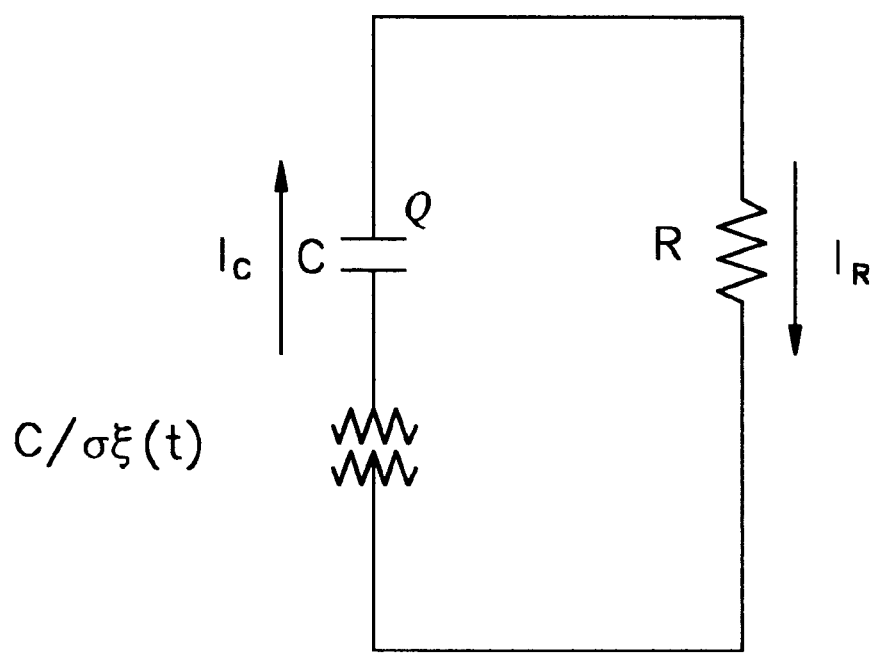
FIG. 3 shows the configuration of the probabilistic switch of FIG. 2.

FIG. 3 shows an example where the probabilistic switch is connected to a capacitor. If multiplicative noise ξ(t) is applied to equation (1), equation (1) is converted into the following equation.

$$\frac{dX}{dt} = (1 + \sigma\xi(t))(-X + X^2) \quad (7)$$

Where ξ(t) indicates a gaussian white noise with mean zero and unit variance, and σ indicates a control parameter of the multiplicative noise intensity. Current I(t), which flows through the capacitor, can be represented by the following equation.

$$I(t) = [C + \sigma(V)\xi(t)]\frac{dV}{dt} \quad (8)$$

With the above-described capacitor, if its capacitance fluctuates according to the voltage applied across it, its fluctuation becomes the multiplicative noise. Accordingly, to apply multiplicative noise means to apply noise whose intensity varies with the state of the nonlinear device. For example, when a capacitor with fluctuating capacitance is connected to an electric circuit, the current, which flows through the circuit, has a multiplicative noise due to the fluctuating capacitance. Thus, current I(t), which flows through the capacitor, is given by multiplication of capacitance with fluctuation and time variation of voltage as shown in equation (8). Here, the capacitance fluctuater so that the current has the multiplicative noise whose intensity varies with time variation of the voltage.

In equation (8), ξ(t) indicates the multiplicative noise, and its intensity is represented by $$\sigma\frac{dV}{dt}$$

which depends on voltage V. The intensity of the multiplicative noise is controlled by the varying parameter σ, which controls the amount of fluctuation of the capacitance, in case of the capacitor. C is average capacitance. The multiplicative noise, whose intensity depends on $$\sigma\frac{dV}{dt},$$

can be applied to the electric circuit by inserting or removing a fluctuating capacitor which swings into/from the circuit. The circuit to which multiplicative noise is applied may be constructed, to be independently operated. Multiplicative noise ξ(t) can be created using a fluctuating resistor, or a fluctuating capacitor.

Figure 4:
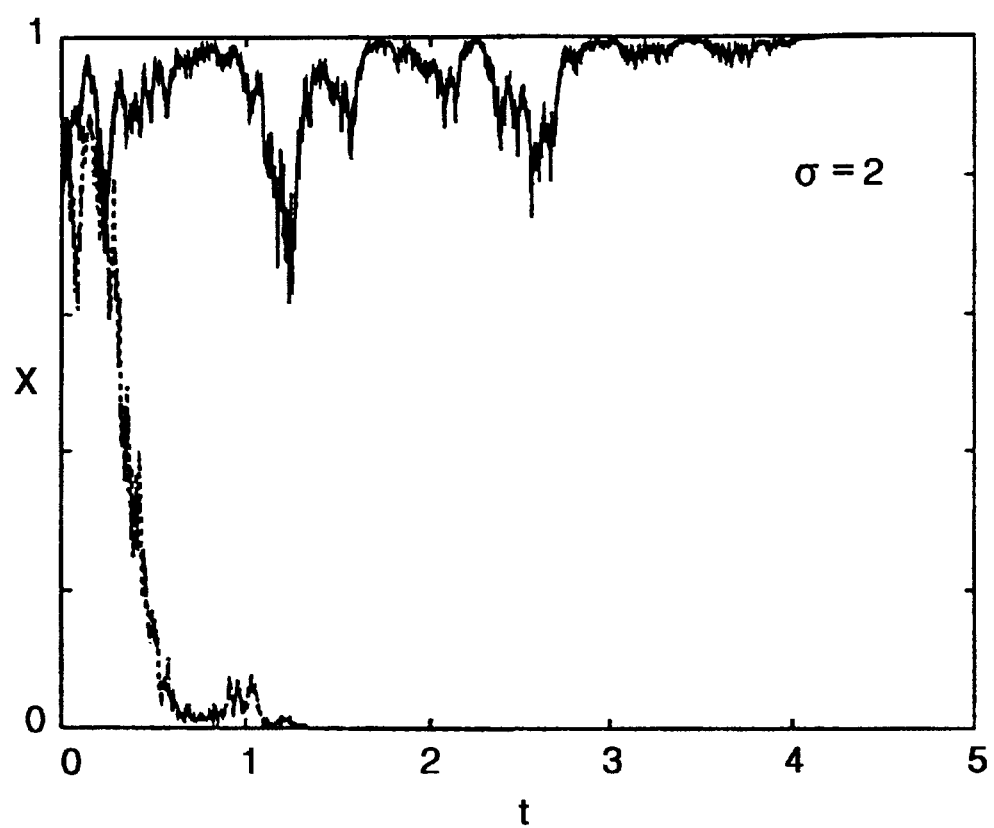
FIG. 4 shows the relationship between time and switch value, in a nonlinear device having multiplicative noise.

As shown in FIG. 3, when the nonlinear device with a fluctuating capacitor is used capacitance C of FIG. 1 is modified to C/(1+σξ(t)). If the nonlinear device has the multiplicative noise ξ(t), the switch value X has '0' without regard to the initial condition, similarly to the case without noise, when the multiplicative noise intensity σ is less than '1' as shown in FIG. 4. When the multiplicative noise intensity σ is above '1', the switch value X has '0' or '1' probabilistically. FIG. 4 shows the cases where the switch values X are '0' and '1' when the multiplicative noise intensity σ is '2'.

Figure 5:
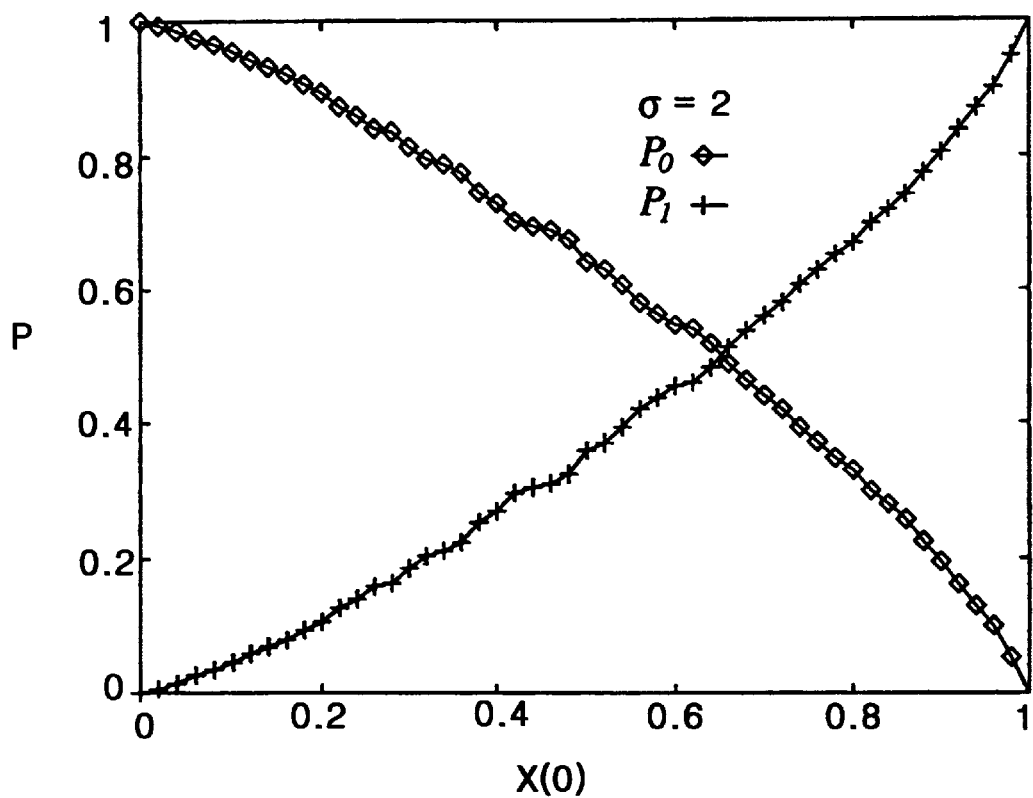
FIG. 5 shows the probability in which the switch value of a nonlinear device having multiplicative noise is decided according to the initial condition at a specific parameter applied to the present invention.

If the initial condition or multiplicative noise intensity σ is changed, the probabilities, in which '0' and '1' are output, are changed. When the initial condition or multiplicative noise intensity is changed, to create a desired probability using FIGS. 5 and 6, the probability, in which the switch output is '1' or '0', is changed. FIG. 5 shows how probability P0, in which the switch output is '0', and probability P1, in which the switch output is '1', are changed according to the initial condition X(0), when the multiplicative noise intensity is '2'. Referring to FIG. 5, probability P0 is increased as initial condition X(0) approaches '0', and probability P1 is increased as initial condition X(0) approaches '1'. Accordingly, probabilities P0 and P1 can be continuously changed between '0' and '1' by controlling initial condition X(0).

Figure 6:
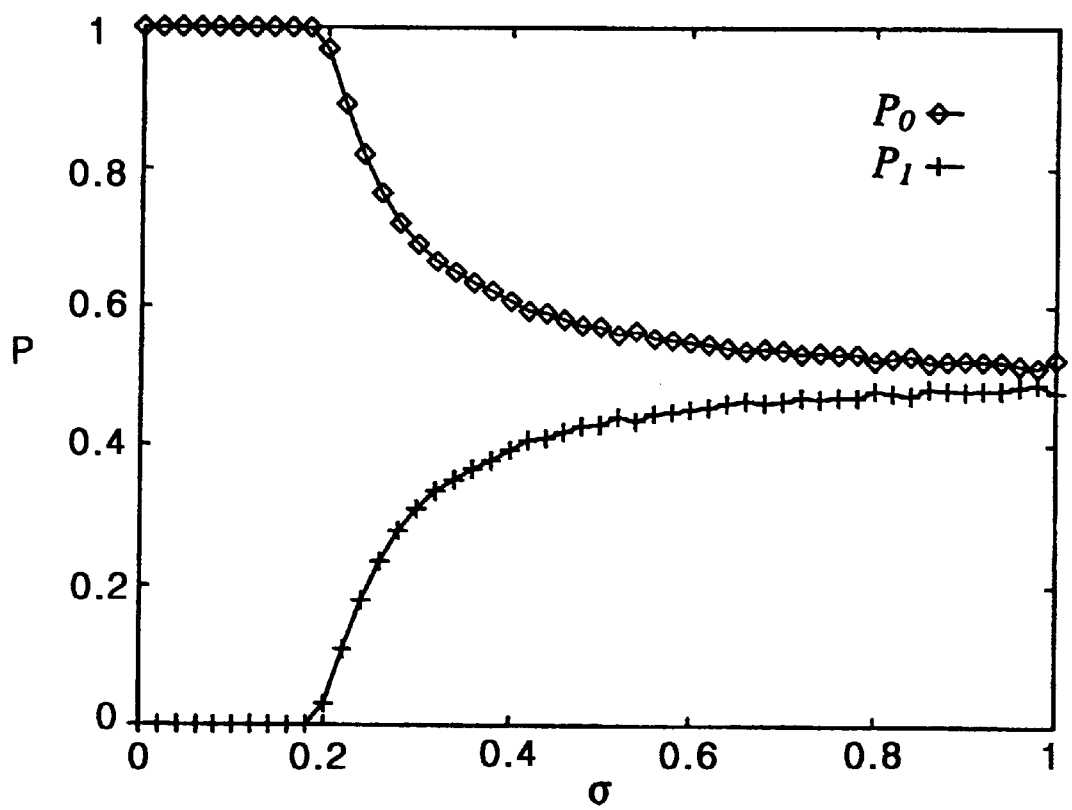
FIG. 6 shows the probability in which switch value of a nonlinear device having multiplicative noise is decided according to a parameter at an arbitrary initial condition.

FIG. 6 shows how probabilities P0 and P1 are changed as the multiplicative noise intensity σ is changed in an arbitrary initial condition. Referring to FIG. 6, since P0=1 and P1=0 when the multiplicative noise is less than '1', the switch value is always '0'. When the multiplicative noise intensity σ exceeds '1', probability P1 increases gradually but probability P0 decreases. If the multiplicative noise intensity σ is very large, probabilities P1 and P0 converge to ½ (50%) respectively.

As described above, the probability of '1' or '0' can be controlled by changing the initial condition or the multiplicative noise intensity. Thus, the probabilistic switch, which takes '0' and '1' probabilistically, can be fabricated by applying multiplicative noise ξ(t) to a nonlinear device. This probabilistic switch can be used as a logic device for realizing hardware which solves a problem requiring probabilistic computation, such as monte carlo simulation or genetic algorithm. When the probabilistic switch is applied to a probabilistic computer, the computer performs computations probabilistically. Accordingly, the probabilistic switch can be used usefully for a problem requiring appropriate solution, like optimization problem. That is, the switch can be used for a problem which seeks appropriate data from massive amount of data.

As described above, since the switch of the present invention probabilistically operates, it can create multiple outputs from one input. Accordingly, when the switch is applied to a probabilistic computer, a complicated problem can be computed rapidly for shorter time.

It will be apparent to those skilled in the art that various modifications and variations can be made in the method for manufacturing a probabilistic switch using multiplicative noise of the present invention without departing from the spirit or scope of the invention. Thus, it is intended that the present invention cover the modifications and variations of this invention provided they come within the scope of the appended claims and their equivalents.

What is claimed is:

1. A method for manufacturing a probabilistic switch in a probabilistic computer for probabilistically performing computations, the method comprising the steps of:
   applying an electrical signal to a nonlinear device;
   applying a multiplicative noise to the nonlinear device, the multiplicative noise having an intensity which varies with an operation state of the nonlinear device; and
   controlling the applied multiplicative noise intensity and an initial condition of the electrical signal applied to the nonlinear device to control probability so as to probabilistically generate different logic signal states.

2. The method in accordance with claim 1, wherein in said controlling step an initial state of a voltage representing the initial condition is increased in an optional multiplicative noise, in order to increase probability where the logic signal state becomes '1', but decrease probability where the logic signal state becomes '0'.

3. The method in accordance with claim 1, wherein in said controlling step the multiplicative noise is increased at an optional initial condition, in order to increase probability where the logic signal state becomes '1', but decrease probability where the logic signal state becomes '0'.

* * * * *